(12) United States Patent
Li et al.

(10) Patent No.: US 10,818,693 B2
(45) Date of Patent: Oct. 27, 2020

(54) ARRAY SUBSTRATE INCLUDING METAL WIRING AND INORGANIC LAYER BOTH WITH BENDING PERFORMANCE ENHANCEMENT STRUCTURES

(71) Applicant: Wuhan China Star Optoelectronics Semiconductor Display Technology Co., Ltd., Wuhan, Hubei (CN)

(72) Inventors: Xue Li, Hubei (CN); Peng Li, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 332 days.

(21) Appl. No.: 15/751,012

(22) PCT Filed: Jan. 23, 2018

(86) PCT No.: PCT/CN2018/073688
§ 371 (c)(1),
(2) Date: Feb. 7, 2018

(87) PCT Pub. No.: WO2019/114101
PCT Pub. Date: Jun. 20, 2019

(65) Prior Publication Data
US 2020/0091197 A1 Mar. 19, 2020

(30) Foreign Application Priority Data
Dec. 12, 2017 (CN) .......................... 2017 1 1343244

(51) Int. Cl.
*H01L 27/12* (2006.01)
*H01L 23/498* (2006.01)

(52) U.S. Cl.
CPC ...... *H01L 27/1218* (2013.01); *H01L 23/4985* (2013.01); *H01L 27/124* (2013.01)

(58) Field of Classification Search
CPC . G09F 9/301; H01L 23/4985; H01L 27/1218; H01L 27/124; H01L 27/3241; H01L 23/49838; H01L 27/1244
(Continued)

(56) References Cited

U.S. PATENT DOCUMENTS

2010/0225624 A1 9/2010 Fu et al.
2014/0098034 A1 4/2014 Hack et al.
(Continued)

FOREIGN PATENT DOCUMENTS

CN 205140985 U 4/2016
CN 106205394 A 12/2016
(Continued)

*Primary Examiner* — Duy T Nguyen
(74) *Attorney, Agent, or Firm* — Hemisphere Law, PLLC; Zhigang Ma

(57) ABSTRACT

The present invention provides an array substrate comprising a substrate, an inorganic layer formed on the substrate, a metal wiring formed on the inorganic layer, and an organic layer on the inorganic layer and covering the metal wiring; wherein the metal wiring and/or the inorganic layer include a bending performance enhancement structure. In this invention, by means of providing the bending performance enhancement structure in the metal wiring and/or the inorganic layer, the stress in the bending region is released when the flexible display is bent, so as to prevent the bending region from fracture or damage and improve the bending performance.

16 Claims, 6 Drawing Sheets

(58) Field of Classification Search
USPC .......................................................... 257/72
See application file for complete search history.

(56) References Cited

U.S. PATENT DOCUMENTS

2016/0035812 A1\* 2/2016 Kwon .................... H01L 27/323
257/40
2017/0309652 A1 10/2017 Qian

FOREIGN PATENT DOCUMENTS

| CN | 106328810 A | 1/2017 |
| CN | 106952937 A | 7/2017 |
| CN | 206684418 U | 11/2017 |

\* cited by examiner

ARRAY SUBSTRATE INCLUDING METAL WIRING AND INORGANIC LAYER BOTH WITH BENDING PERFORMANCE ENHANCEMENT STRUCTURES

RELATED APPLICATIONS

The present application is a National Phase of International Application Number PCT/CN2018/073688, filed Jan. 23, 2018, and claims the priority of China Application No. 201711343244.X, filed Dec. 12, 2017.

FIELD OF THE DISCLOSURE

The present invention relates to a field of display technology, and in particular to an array substrate.

BACKGROUND

OLED (Organic Light-Emitting Diode) display got people's attention because of its high contrast, wide color gamut, thin, energy saving, etc. Compared with other displays, a main feature of the OLED display is able to achieve a flexible display. The flexible display is going to become a mainstream technology in the future, so the provision of the OLED display is developing toward a direction of being thin, bendable, and easy to be carried.

In a long-term research and development, the inventor of the present application found that in current flexible display, the wiring of conductive lines in a bending region generally adopts a straight metal line around the whole area, and an inorganic layer and an isolation layer below the conductive lines are also arranged in the whole area. Stress generated during bending is thus not able to be released, which easily creates fracture or damage to the bending region, and diminishes its bending performance.

SUMMARY

The present invention provides an array substrate, which solves the technical problem in the prior art that stress in the bending region of the flexible display cannot be released during bending and easily causes fracture or damage to the display and a low bending performance.

In order to solve the above technical problem, one aspect of the present invention is to provide an array substrate comprising a substrate, an inorganic layer formed on the substrate, a metal wiring formed on the inorganic layer, and an organic layer overlying the inorganic layer and covering the metal wiring, wherein the metal wiring and/or the inorganic layer includes a bending performance enhancement structure;

the bending performance enhancement structure of the metal wiring is a hollow structure in at least part of the metal wiring;

the array substrate comprises a display region and a bending region; and the inorganic layer, the metal wiring and the organic layer are disposed in the bending region, and the bending region is located at bottom of the array substrate and/or both sides of the display region.

In order to solve the above technical problem, another technical solution adopted by the present invention is to provide an array substrate comprising a substrate, an inorganic layer formed on the substrate, a metal wiring formed on the inorganic layer, and an organic layer on the inorganic layer and covering the metal wiring, wherein the metal wiring and/or the inorganic layer include a bending performance enhancement structure.

In the present invention, by means of providing the bending performance enhancement structure in the metal wiring and/or the inorganic layer, the stress in the bending region is released when the flexible display is bent, so as to prevent the bending region from fracture or damage and improve the bending performance.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments. However, the described embodiments are only a part but not all of the embodiments of the present invention. All other embodiments obtained by a person of ordinary skill in the art based on the embodiments of the present invention without creative efforts shall fall within the protection scope of the present invention.

Figure 1:
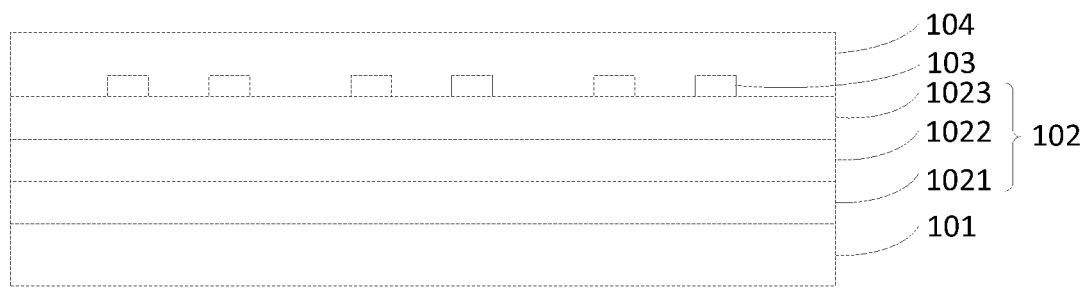
FIG. 1 is a schematic structural cross-sectional view of an array substrate according to an embodiment of the present invention.
Figure 2:
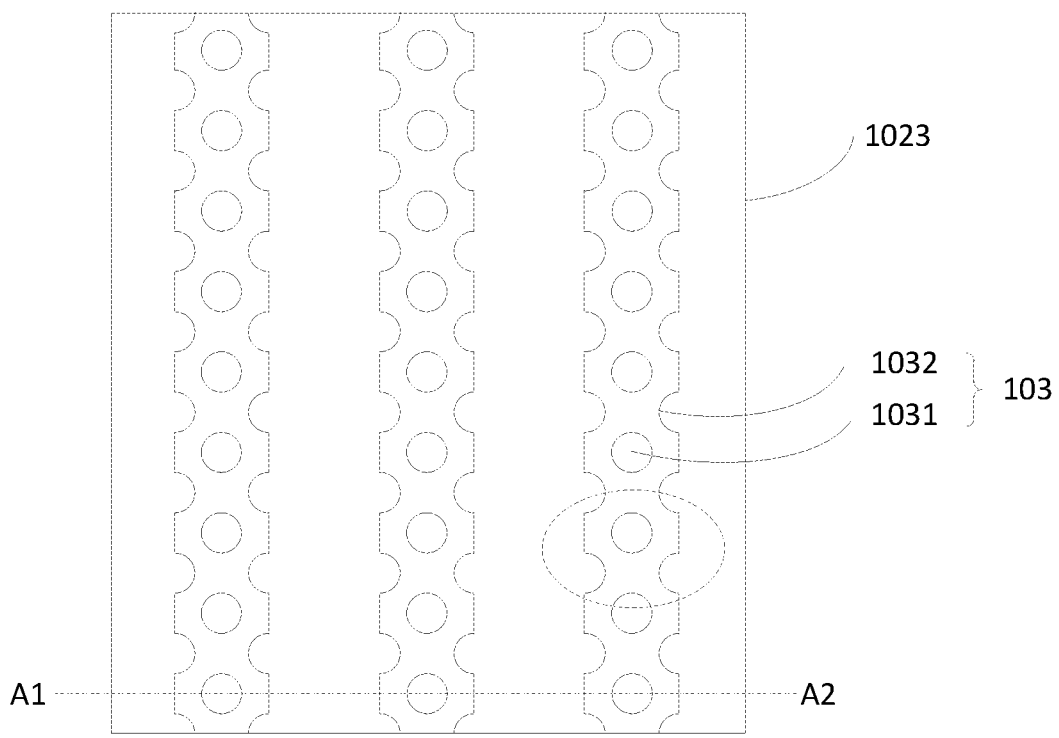
FIG. 2 is a schematic structural top view of an array substrate according to an embodiment of the present invention.
Figure 3:
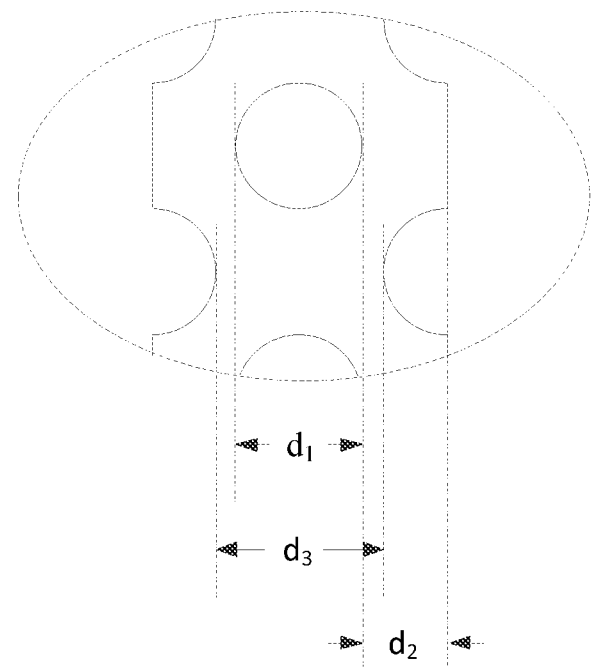
FIG. 3 is a partially enlarged schematic view of a metal wiring of the array substrate according to an embodiment of the present invention.

Referring to FIGS. 1 to 3, an embodiment of an array substrate according to the present invention includes a substrate 101, an inorganic layer 102 formed on the substrate 101, a metal wiring 103 formed on the inorganic layer 102, and an organic layer 104 formed on the inorganic layer 102 and covering the metal wiring 103; wherein the metal wiring 103 includes a bending performance enhancement structure.

FIG. 1 is a cross-sectional view of the array substrate taken along a line of A1-A2 in FIG. 2. The inorganic layer 102 includes a first inorganic layer 1022 and a second inorganic layer 1023 disposed on the first inorganic layer 1022. The metal wiring 103 is disposed on the second inorganic layer 1023. The bending performance enhancement structure of the metal wiring 103 is a structure that at least a part of the metal wiring 103 is a hollow structure including a plurality of through holes 1031 disposed in the metal wiring 103 and a plurality of notches 1032 disposed on edges of the metal wiring. The through hole 1031 is a circular through hole with a diameter d1 of 3-5 µm, for example 3 µm, 4 µm or 5 µm. The notch 1032 is a semicircular notch with a diameter (not shown) of 3-5 µm, for example 3 µm, 4 µm or 5 µm. The notches 1032 and the through holes 1031 are located on a same straight line or staggered with offset.

In this embodiment, the inorganic layer 102 may further include an isolation layer 1021. The isolation layer 1021 is disposed on the substrate 101. The first inorganic layer 1022 is disposed on the isolation layer 1021.

In this embodiment, the notches 1032 and the through holes 1031 are arranged in a staggered manner, and a plurality of notches 1032 are provided on both edges of the metal wiring 103. The distance d2 between the edge of the through hole 1031 and the edge of the metal wiring 103 is 1.5-3.75 µm, for example 1.5 µm, 2.5 µm or 3.75 µm. The distance d3 between two notches 1032 opposite to each other is 3.75-7.5 µm, such as 3.75 µm, 4.5 µm or 7.5 µm. A proportional number of d1:d2:d3 is 2:1:3 to 4:3:5, such as 2:1:3, 3:2:4 or 4:3:5.

In other embodiments, the notches 1032 may be disposed on only one edge of the metal wiring 103.

Optionally, the through holes 1031 in the middle part of the metal wiring 103 are arranged in a periodic manner. The notches 1032 on two edges of the metal wiring 103 are periodically arranged, and the through holes 1031 and the notches 1032 are alternately disposed.

Optionally, the through hole 1031 and the notch 1032 in the metal wiring 103 may be other shapes such as a square or a polygon.

Figure 4:
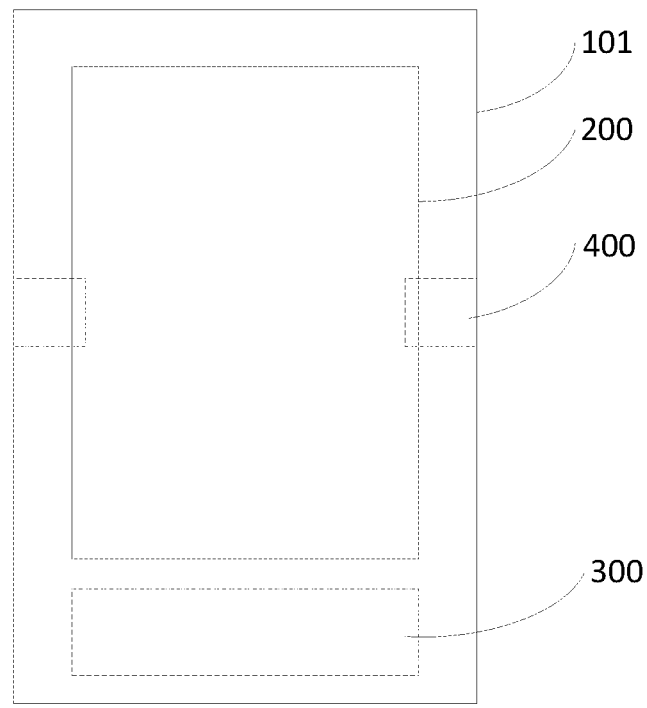
FIG. 4 is a schematic structural view of the array substrate according to an embodiment of the present invention.

Referring to FIGS. 1 and 4, the array substrate includes a substrate 101, and the substrate 101 includes a display region 200 and a bending region. The inorganic layer 102, the metal wiring 103, and the organic layer 104 are disposed in the bending region, and the bending region is located at bottom 300 of the substrate 101 and/or two side areas 400 of the display region 200.

Optionally, the bent regions may also be located in other areas of the array substrate that need to be bent.

In the embodiment of the present invention, by means of setting the bending performance enhancement structure in the metal wiring, the stress in the metal wiring in the bending region is released when the flexible display is bent, thereby avoiding the occurrence of breakage or damage in the bending region and improving the bendable performance.

Referring to FIGS. 5 to 8, an array substrate according to another embodiment of the present invention includes a substrate 201, an inorganic layer 202 formed on the substrate 201, a metal wiring 204 formed on the inorganic layer 202, and an organic layer 205 formed on the inorganic layer 202 and covering the metal wiring 204; wherein, the inorganic layer 202 includes a bending performance enhancement structure.

Figure 5:
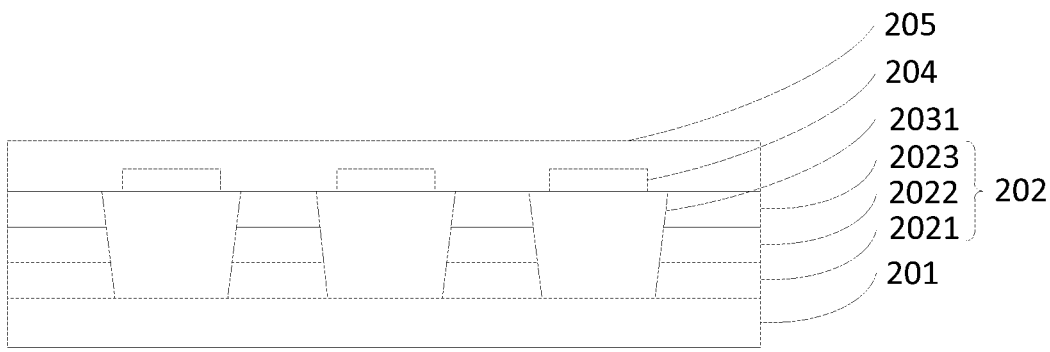
FIG. 5 is a schematic structural cross-sectional view of the array substrate according to another embodiment of the present invention.
Figure 6:
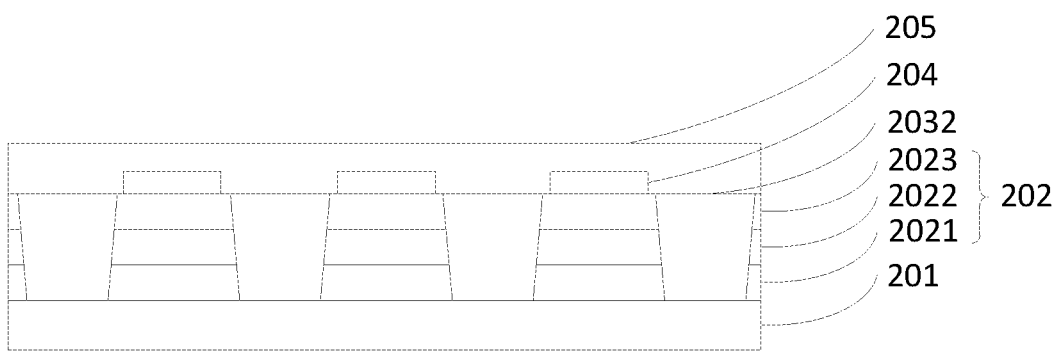
FIG. 6 is a schematic structural cross-sectional view of the array substrate according to another embodiment of the present invention.
Figure 7:
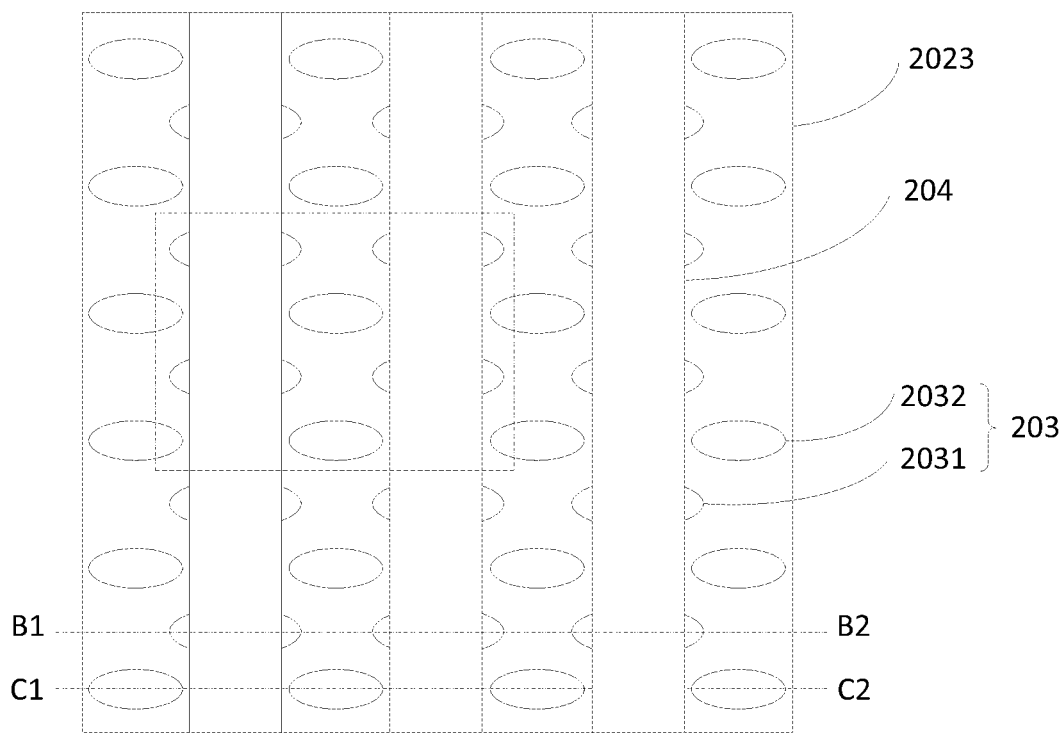
FIG. 7 is a schematic structural top view of the array substrate according to another embodiment of the present invention.
Figure 8:
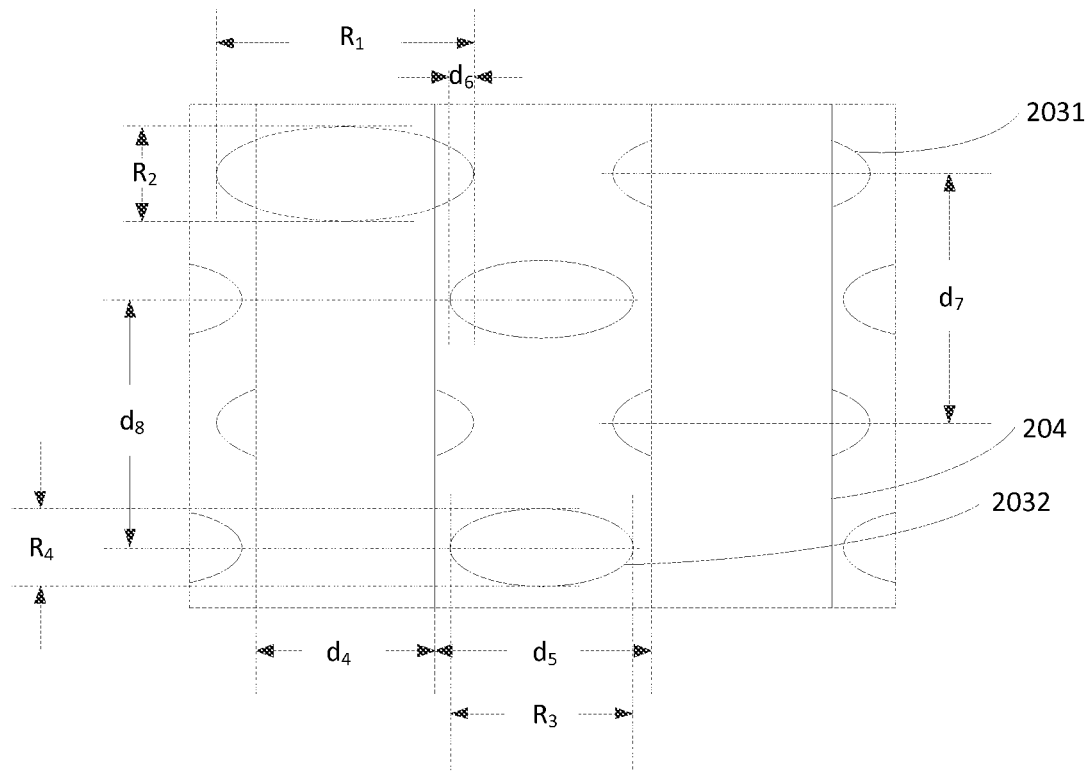
FIG. 8 is a partially enlarged schematic view of a metal wiring and an organic layer of the array substrate according to another embodiment of the present invention.

FIG. 5 is a cross-sectional view of the array substrate along a line of B1-B2 in FIG. 7, and FIG. 6 is a cross-sectional view of the array substrate along a line of C1-C2 in FIG. 7. The bending performance enhancement structure of the inorganic layer 202 is a structure that the inorganic layer 202 is provided with a plurality of hole-digging regions 203 filled with organic substances. The hole-digging regions 203 include a plurality of first hole-digging regions 2031 and a plurality of second hole-digging regions 2032. The plurality of first hole-digging regions 2031 and the plurality of second hole-digging regions 2032 are respectively disposed in a same straight line or are staggered with offset.

In this embodiment, the plurality of first hole-digging regions 2031 and the plurality of second hole-digging regions 2032 are respectively arranged in a matrix. In other embodiments, the plurality of first hole-digging regions 2031 and the plurality of second hole-digging regions 2032 may also be arranged in one period, two periods, or alternative periods.

The first hole-digging regions 2031 are correspondingly disposed in a region of the inorganic layer 202 that is covered by the metal wiring 204. The second hole-digging regions 2032 are embedded in a region of the inorganic layer 202 that is not covered by the metal wiring 204. The width of the metal wiring 204 corresponding to the first hole-digging region 2031 is smaller than the width of the first hole-digging region 2031.

The inorganic layer 202 includes a first inorganic layer 2022 and a second inorganic layer 2023 disposed on the first inorganic layer 2022. A cross-section of the first hole-digging region 2031 in a plane contacted by the second inorganic layer 2023 and the organic layer 205 is in a shape of a first ellipse. The length R1 of the major axis of the first ellipse is greater than the width d4 of the metal wiring 204. A cross-section of the second hole-digging region 2032 in a plane contacted by the second inorganic layer 2023 and the organic layer 205 is in a shape of a second ellipse. The length R3 of the major axis of the second ellipse is smaller than a pitch d5 of adjacent metal wirings 204.

In this embodiment, the inorganic layer 202 further includes an isolation layer 2021. The isolation layer 2021 is disposed on the substrate 201. The first inorganic layer 2022 is disposed on the isolation layer 2021. The hole-digging regions 203 may also be disposed in the isolation layer 2021.

Optionally, a distance between geometric centers of two adjacent first ellipses corresponding to a same column of metal wiring 204 is 18-24 µm, for example 18 µm, 21 µm or 24 µm. A distance between geometrical centers of two adjacent second ellipses in a region corresponding to a same column of organic layers 205 that does not cover the metal wiring 204 is 18-24 µm, for example 18 µm, 21 µm or 24 µm. The length d6 of an overlapping of the first ellipse and the second ellipse that are projected in a direction along the metal wiring 204 is greater than 1 µm, for example 1.5 µm or 2 µm.

Optionally, the ratio of the length R1 of the major axis of the first ellipse to the length R2 of the minor axis thereof may be 3:1 to 2:1, for example 3:1, 7:3 or 2:1. The ratio of length R3 of the major axis of the second ellipse to the length R4 of the minor axis thereof may be 4:1 to 5:2, such as 4:1, 3:1, or 5:2.

Optionally, the hole-digging regions 203 may be formed by digging holes in the isolation layer 2021, the first organic layer 2022, and the second organic layer 2023 based upon the shape of the hole-digging regions and then being filled with organic substance, after forming the isolation layer 2021, the first organic layer 2022 and the second organic layer 2023. The isolation layer 2021, the first organic layer 2022, and the second organic layer 2023 can also be formed after forming the organic substance on the substrate 201.

Optionally, the substrate 201 may be made of polyimide (PI). The first inorganic layer 2022 and the second inorganic layer 2023 may be made of materials such as silicon nitride (SiNx), silicon oxide (SiOx). Organic substance can be organic photoresist.

Optionally, the bendable property of the organic material is better than the bendable property of the material comprising the isolation layer 2021, the first inorganic layer 2022 and the second inorganic layer 2023.

In this embodiment of the present invention, by means of the bending performance enhancement structure provided in the inorganic layer, the stress in the inorganic layer in the bending region is released when the flexible display is bent, which in turn prevents fracture or damage in the bending region and improve the bendable performance thereof.

Figure 9:
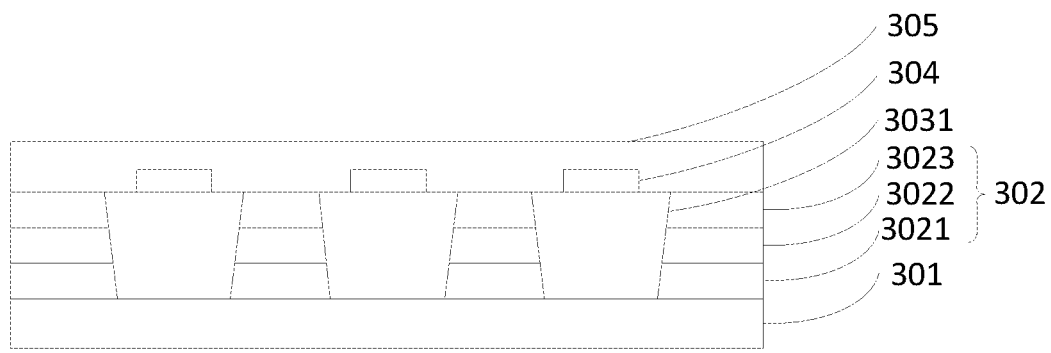
FIG. 9 is a schematic structural cross-sectional view of the array substrate according to further another embodiment of the present invention.
Figure 10:
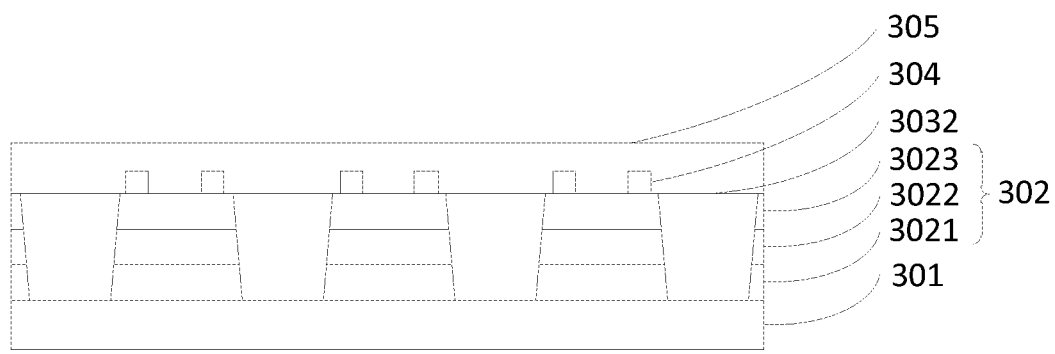
FIG. 10 is a schematic structural cross-sectional view of the array substrate according to further another embodiment of the present invention.
Figure 11:
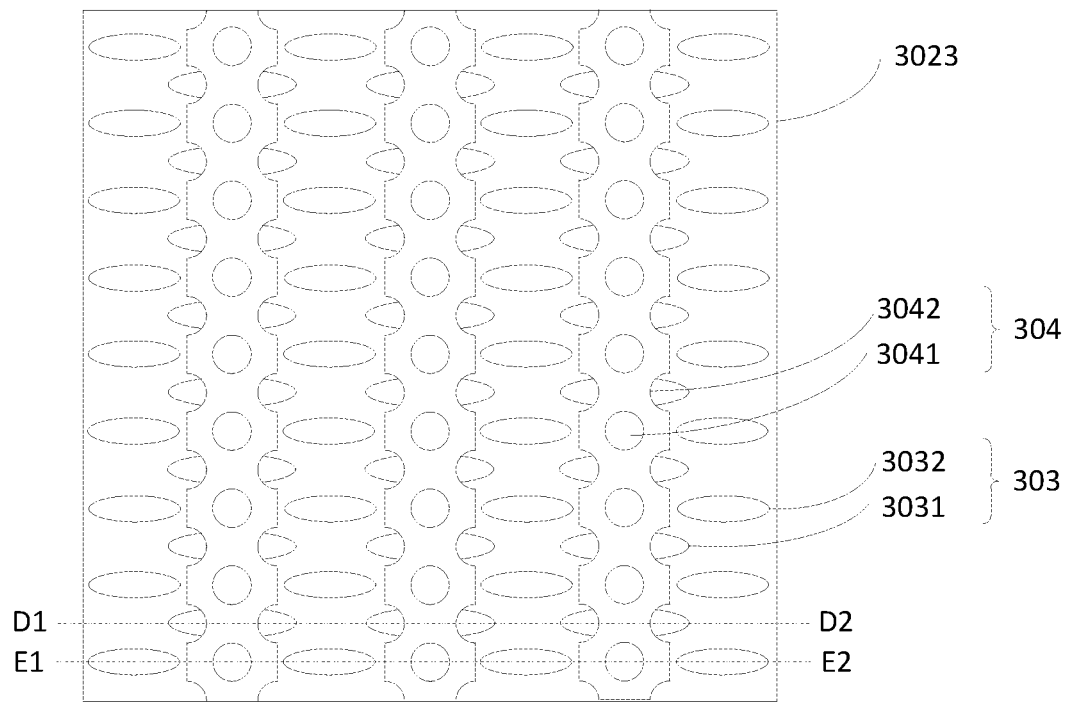
FIG. 11 is a schematic structural top view of the array substrate according to further another embodiment of the present invention.

Referring to FIGS. 9 to 11, the array substrate according to yet another embodiment of the present invention includes a substrate 301, an inorganic layer 302 formed on the substrate 301, a metal wiring 304 formed on the inorganic layer 302, an organic layer 305 formed on the inorganic layer 302 and covering the metal wiring 304; wherein both the metal wiring 304 and the inorganic layer 303 include a bending performance enhancement structure.

FIG. 9 is a cross-sectional view of the array substrate taken along a line of D1-D2 in FIG. 11. FIG. 10 is a cross-sectional view of the array substrate taken along a line of E1-E2 in FIG. 11.

Specifically, the bending performance enhancement structure of the metal wiring 304 according to this embodiment of the present invention includes the through holes 3041 and the notches 3042. The bending performance enhancement structure of the inorganic layer 302 is the hole-digging regions 303 filled with organic substance. The structures of the metal wiring 304 and the hole-digging region 303, are referred to the above embodiment of the array substrate.

The first hole-digging region 3031 is disposed in a region of the inorganic layer 302 that corresponds to the notch 3042 so as to form a staggered structure, so as to release the stress of the bending region more directly and effectively.

By means of the above structure, the stress generated during the curling of the metal wiring can be released at a certain degree, and the damage to the device can be reduced. The scrolling capability of the product is improved due to add organic substance into the inorganic layer, and the times of scrolling the array substrate is further increased. The above array substrate can be used in a flexible organic light-emitting diode display apparatus.

In this embodiments of the present invention, by means of the bending performance enhancement structures provided in the metal wiring and the inorganic layer, the stress in the metal wiring and the inorganic layer of the bending region is released when the flexible display is bent, which in turn prevents breakage or damage in the bending region, and improve the bending performance thereof.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An array substrate comprising a substrate, an inorganic layer formed on the substrate, a metal wiring formed on the inorganic layer, and an organic layer overlying the inorganic layer and covering the metal wiring, wherein the metal wiring and the inorganic layer each includes a bending performance enhancement structure;
   the bending performance enhancement structure of the metal wiring is a hollow structure in at least part of the metal wiring;
   the array substrate comprises a display region and a bending region; and
   the inorganic layer, the metal wiring and the organic layer are disposed in the bending region, and the bending region is located at bottom of the array substrate and/or both sides of the display region;
   wherein the bending performance enhancement structure of the inorganic layer is a structure that the inorganic layer is provided with a plurality of hole-digging regions filled with organic substances; the hole-digging regions include a plurality of first hole-digging regions and a plurality of second hole-digging regions; and, the plurality of first hole-digging regions and the plurality of second hole-digging regions are respectively disposed in a same straight line or are staggered with offset.

2. The array substrate as claimed in claim 1, wherein the hollow structure including a plurality of through holes disposed in the metal wiring and a plurality of notches disposed on edges of the metal wiring; and, the notches and the through holes are located on a same straight line or staggered with offset.

3. The array substrate as claimed in claim 2, wherein a diameter of the through hole is d1, a distance between an edge of the through hole and the edge of the metal wiring is d2, and a distance between two oppositely disposed notches of the plurality of notches is d3, wherein d1:d2:d3 is 2:1:3 to 4:3:5.

4. The array substrate as claimed in claim 1, wherein the first hole-digging regions are correspondingly disposed in a region of the inorganic layer that is covered by the metal wiring, and the second hole-digging regions are disposed in a region of the inorganic layer that is not covered by the metal wiring.

5. The array substrate as claimed in claim 4, wherein the first hole-digging region is disposed in a region of the inorganic layer that corresponds to the notch.

6. The array substrate as claimed in claim 1, wherein the inorganic layer includes a first inorganic layer and a second inorganic layer disposed on the first inorganic layer; a cross-section of the first hole-digging region in a plane contacted by the second inorganic layer and the organic layer is in a shape of a first ellipse; a distance between geometric centers of two adjacent first ellipses corresponding to a same column of metal wiring is 18-24 μm; a cross-section of the second hole-digging region in a plane contacted by the second inorganic layer and the organic layer is in a shape of a second ellipse; and, a distance between geometrical centers of two adjacent second ellipses in a region corresponding to a same column of organic layers that does not cover the metal wiring is 18-24 μm.

7. The array substrate as claimed in claim 6, wherein
a length of a major axis of the first ellipse is greater than a width of the metal wiring; a length of a major axis of the second ellipse is smaller than a pitch of adjacent metal wirings; and a length of an overlapping of the first ellipse and the second ellipse that are projected in a direction along the metal wiring is greater than 1 μm.

8. An array substrate comprising a substrate, an inorganic layer formed on the substrate, a metal wiring formed on the inorganic layer, and an organic layer on the inorganic layer and covering the metal wiring, wherein the metal wiring and the inorganic layer each includes a bending performance enhancement structures;

wherein the bending performance enhancement structure of the inorganic layer is a structure that the inorganic layer is provided with a plurality of hole-digging regions filled with organic substances; the hole-digging regions include a plurality of first hole-digging regions and a plurality of second hole-digging regions; and, the plurality of first hole-digging regions and the plurality of second hole-digging regions are respectively disposed in a same straight line or are staggered with offset.

9. The array substrate as claimed in claim 8, wherein the bending performance enhancement structure of the metal wiring is a hollow structure in at least part of the metal wiring.

10. The array substrate as claimed in claim 9, wherein the hollow structure including a plurality of through holes disposed in the metal wiring and a plurality of notches disposed on edges of the metal wiring; and, the notches and the through holes are located on a same straight line or staggered with offset.

11. The array substrate as claimed in claim 10, wherein a diameter of the through hole is d1, a distance between an edge of the through hole and the edge of the metal wiring is d2, and a distance between two oppositely disposed notches of the plurality of notches is d3, wherein d1:d2:d3 is 2:1:3 to 4:3:5.

12. The array substrate as claimed in claim 8, wherein the first hole-digging regions are correspondingly disposed in a region of the inorganic layer that is covered by the metal wiring, and the second hole-digging regions are disposed in a region of the inorganic layer that is not covered by the metal wiring.

13. The array substrate as claimed in claim 12, wherein the first hole-digging region is disposed in a region of the inorganic layer that corresponds to the notch.

14. The array substrate as claimed in claim 8, wherein the inorganic layer includes a first inorganic layer and a second inorganic layer disposed on the first inorganic layer; a cross-section of the first hole-digging region in a plane contacted by the second inorganic layer and the organic layer is in a shape of a first ellipse; a distance between geometric centers of two adjacent first ellipses corresponding to a same column of metal wiring is 18-24 μm; a cross-section of the second hole-digging region in a plane contacted by the second inorganic layer and the organic layer is in a shape of a second ellipse; and, a distance between geometrical centers of two adjacent second ellipses in a region corresponding to a same column of organic layers that does not cover the metal wiring is 18-24 μm.

15. The array substrate as claimed in claim 14, wherein
a length of a major axis of the first ellipse is greater than a width of the metal wiring; a length of a major axis of the second ellipse is smaller than a pitch of adjacent metal wirings; and a length of an overlapping of the first ellipse and the second ellipse that are projected in a direction along the metal wiring is greater than 1 μm.

16. The array substrate as claimed in claim 8, wherein the array substrate comprises a display region and a bending region; and, the inorganic layer, the metal wiring and the organic layer are disposed in the bending region, and the bending region is located at bottom of the array substrate and/or both sides of the display region.

* * * * *